(12) United States Patent
Matthies et al.

(10) Patent No.: US 6,370,019 B1
(45) Date of Patent: Apr. 9, 2002

(54) SEALING OF LARGE AREA DISPLAY STRUCTURES

(75) Inventors: Dennis Lee Matthies, Princeton; Zilan Shen, Lawrenceville; Roger Green Stewart, Neshanic Station; James Harold Atherton, Ringoes, all of NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/250,329

(22) Filed: Feb. 16, 1999

Related U.S. Application Data

(60) Provisional application No. 60/074,922, filed on Feb. 17, 1998.

(51) Int. Cl.[7] ................................................ H05K 1/18
(52) U.S. Cl. ........................ 361/681; 361/681; 361/682; 345/50; 345/55; 345/59; 349/153; 313/422; 313/495; 315/169.1; 315/169.2; 315/169.3
(58) Field of Search .............................. 345/50, 55, 59, 345/60, 33, 38; 349/73, 153, 190; 313/506, 509, 510, 512, 422, 495; 315/169.1, 169.2, 169.3; 361/681, 682

(56) References Cited

U.S. PATENT DOCUMENTS

| | | | | |
|---|---|---|---|---|
| 4,204,205 A | | 5/1980 | Yagi et al. .................... 340/719 |
| 4,490,647 A | * | 12/1984 | Andreadakia ................ 313/586 |
| 5,106,197 A | * | 4/1992 | Ohuchida et al. ............. 359/83 |
| 5,371,437 A | * | 12/1994 | Amano ..................... 315/169.1 |
| 5,585,695 A | | 12/1996 | Kitai ........................... 313/506 |
| 5,654,781 A | * | 8/1997 | Izumi .......................... 349/139 |
| 5,697,825 A | | 12/1997 | Dynka et al. ................. 445/25 |
| 5,703,394 A | | 12/1997 | Wei et al. .................... 257/433 |
| 5,781,258 A | | 7/1998 | Dabral et al. ................. 349/73 |
| 5,815,232 A | * | 9/1998 | Miyazaki et al. ............ 349/155 |
| 5,827,102 A | | 10/1998 | Watkins et al. ................ 445/25 |
| 5,847,785 A | * | 12/1998 | Izumi .......................... 349/73 |
| 5,867,236 A | | 2/1999 | Babuka et al. ................ 349/73 |
| 5,889,568 A | * | 3/1999 | Seraphim et al. ............. 349/73 |
| 5,905,559 A | * | 5/1999 | Fujiwara et al. ............ 349/190 |
| 5,909,081 A | * | 6/1999 | Eida et al. ................... 313/504 |
| 6,002,456 A | * | 12/1999 | Togawa ........................ 349/32 |
| 6,163,357 A | * | 12/2000 | Nakamura ................... 349/155 |
| 6,181,405 B1 | * | 1/2001 | Izumi .......................... 349/153 |
| 6,249,329 B1 | * | 6/2001 | Dabral et al. ................. 349/73 |

FOREIGN PATENT DOCUMENTS

| | | |
|---|---|---|
| EP | 0 560 072 A | 9/1993 |
| EP | 0 732 868 A | 9/1996 |

OTHER PUBLICATIONS

S. C. Thayer "Active–Driven TFEL Displays Using Ceramic Tiling", SID 93 DIGEST, pp. 618–621.

(List continued on next page.)

*Primary Examiner*—Leo P. Picard
*Assistant Examiner*—David Foster
(74) *Attorney, Agent, or Firm*—William J. Burke

(57) ABSTRACT

A plurality of sealing methods may be used either alone or in combination with each other to seal an electronic display structure. The display module includes a first substrate having a plurality of column electrodes. Each of a plurality of portions of a display material are coupled to one of the plurality of column electrodes and to one of a plurality of row electrodes. A pixel seal may be formed over the display material to encapsulate the display material. An area seal may be formed upon the first substrate to encapsulates the row electrodes, the column electrodes, and the portions of display material. A bead seal may be formed around the perimeter of the first substrate to couple it to a second substrate while sealing the internal display material. An edge seal may be formed by a banded structure spanning from the first substrate to the second substrate and extending around the perimeter of the substrates.

28 Claims, 6 Drawing Sheets

OTHER PUBLICATIONS

S. C. Thayer, "Late–News Paper: Modular Wall–Size IC–Driven Flat–Panel Displays", SID 92 DIGEST, pp. 950–953.

International Search Report.

Burrows P E Et Al.: "Realiability and Degradation of Organic Light Emitting Devices" Applied Physics Letters, vol. 65, No. 23, Dec. 5, 1994, pp. 2922–2924.

G. Mueller, R. Mach, G. U. Reinsperger, L. Schrottke; "Tiling Thin–Film Electroluminescent Displays," SID 91 Digest, pp. 567–570.

S.C. Thayer, "Late–News Paper: Modular Wall–Size IC–Driven Flat–Panel Displays," SID 92 Digest, pp. 950–953.

N. Mazurek, T. Zammit, "A 51–in.–Diagonal Tiled LCD VGA Monitor," SID 93 Digest, pp. 614–617.

S. C. Thayer, "Active–Driven TFEL Displays Using Ceramic Tiling," SID 93 Digest, pp. 618–621.

Yamada et al., "Components and Materials for Liquid Crystal Display (LCD)," 14 pp., Sony Chemical Corp., Brochure—Marketing Technical Publication.

* cited by examiner

SEALING OF LARGE AREA DISPLAY STRUCTURES

This application claims the benefit of priority from U.S. Provisional application No. 60/074,922 filed Feb. 17, 1998.

FIELD OF THE INVENTION

The present invention relates to sealing large area display structures, and, more particularly, to sealing tiled OLED display structures.

BACKGROUND OF THE INVENTION

Electronic display structures are devices that produce patterns of light in response to electrical signals. Different types of display materials may be used for providing the patterns of light. Display structures in which the display materials generate light are known as emissive displays. Emissive displays may be formed using display materials such as organic light emitting diode (OLED) materials. Other types of emissive displays include plasma displays, field emissive displays and electroluminescent displays. Display structures in which the display materials pass or reflect light rather than generate light are known as light-valves. Liquid crystal displays (LCDs) are one form of a light-valve type display structure.

Rather than building a single large electronic display structure (monolithic display), electronic display structures may be mounted adjacent to each other to form tiled displays. A tiled display may function as a single display of a larger size. Tiling of display structures allows for flexibility in size and shape of displays. Tiling is not subject to many of the problems that limit the size of monolithic display technologies. The complexity law does not apply because the basic unit of manufacture in tiled displays may be less complex than large monolithic displays. The size law is not a limiting factor because the basic unit of manufacture is relatively small. Tiled displays obey a scaling-law which is not exponential but linear with display area. This fundamentally different scaling behavior is one advantage of tile technology which results in reduced manufacturing costs.

It is desirable to minimize visibility of the junction between adjacent display structures included in a tiled display. Each individual tile or display structure has a front display surface on which an image is formed. In many cases this surface is protected with a glass cover. Tiles are fastened in a matter for their front glass covers to be adjacent to each other.

Display structures are typically fabricated by coupling top and bottom substrates together. Because many display materials require that a vacuum, moisture or hermetic seal be maintained around the pixels of the display structure, it is desirable that the mechanical junction between top and bottom substrates also serve as a sealing mechanism. The integrity of a sealing mechanism may be critical for predictable device performance and to ensure a predictable device lifetime.

The patterns of light formed by display structures in response to electrical signals are formed by individual display elements or pixels. To independently control the light corresponding to each pixel, each pixel may be addressed using electrical signals. For a display structure having top and bottom substrates, it may be desirable to couple these electrical signals between the substrates. It is often difficult to couple these signals to the display structure due to the large number of signals and the desire to simultaneously seal the display material of the display structure.

The visibility of seams, the need to couple electrical signals, and the need to seal a display provide conflicting display manufacturing goals. A thicker and more robust seal at a tile boundary may increase the width of the seam between tiles and result in the seam becoming more visible.

To overcome the shortcomings of conventional methods of sealing tiled display structures, a new method of sealing tiled display structures is provided.

SUMMARY OF THE INVENTION

The present invention provides an electronic display structure comprising a display module and an area seal. The display module includes a first substrate having a plurality of column electrodes. Each of a plurality of portions of a display material are coupled to one of the plurality of column electrodes and to one of a plurality of row electrodes. The area seal is formed upon the first substrate and encapsulates the row electrodes, the column electrodes, and the portions of display material.

According to one aspect of the present invention, the area seal comprises an anisotropically conductive structure for encapsulating the plurality of row electrodes, the plurality of column electrodes, and the plurality of portions of the display material, and for coupling each of the plurality of row and column electrodes to a respective signal line.

According to another aspect of the present invention, a processing step of forming the anisotropically conductive structure is used to both seal the electronic display structure and to couple the display module to the circuit module.

According to another aspect of the present invention, the electronic display structure also includes a circuit module including plurality of signal lines each corresponding to one of the plurality of row and column electrodes and the anisotropically conductive structure seals the circuit module and the display module, adheres the circuit module to the display module, and couples each of the plurality of row and column electrodes to its respective signal line.

According to another aspect of the present invention, the anisotropically conductive structure is substantially black.

According to another aspect of the present invention, the plurality of row electrodes is coupled to and encapsulates each of the plurality of portions of the display material.

According to another aspect of the present invention, the electronic display structure comprises a band seal spanning from the display module to the circuit module and extending around the perimeter of the circuit and display modules.

According to another aspect of the present invention, the display material includes an organic electroluminescent material.

According to another aspect of the present invention, a bead seal couples an outer area of the display module to an outer area of the circuit module and a masking layer acts to hide the bead seal when the display structure is viewed from the first surface of the substrate.

According to another aspect of the present invention, the bead seal occupies an area less than one-half of the gap between pixels to minimize the visual perception of seams between adjacent display tiles.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION

Figure 1:
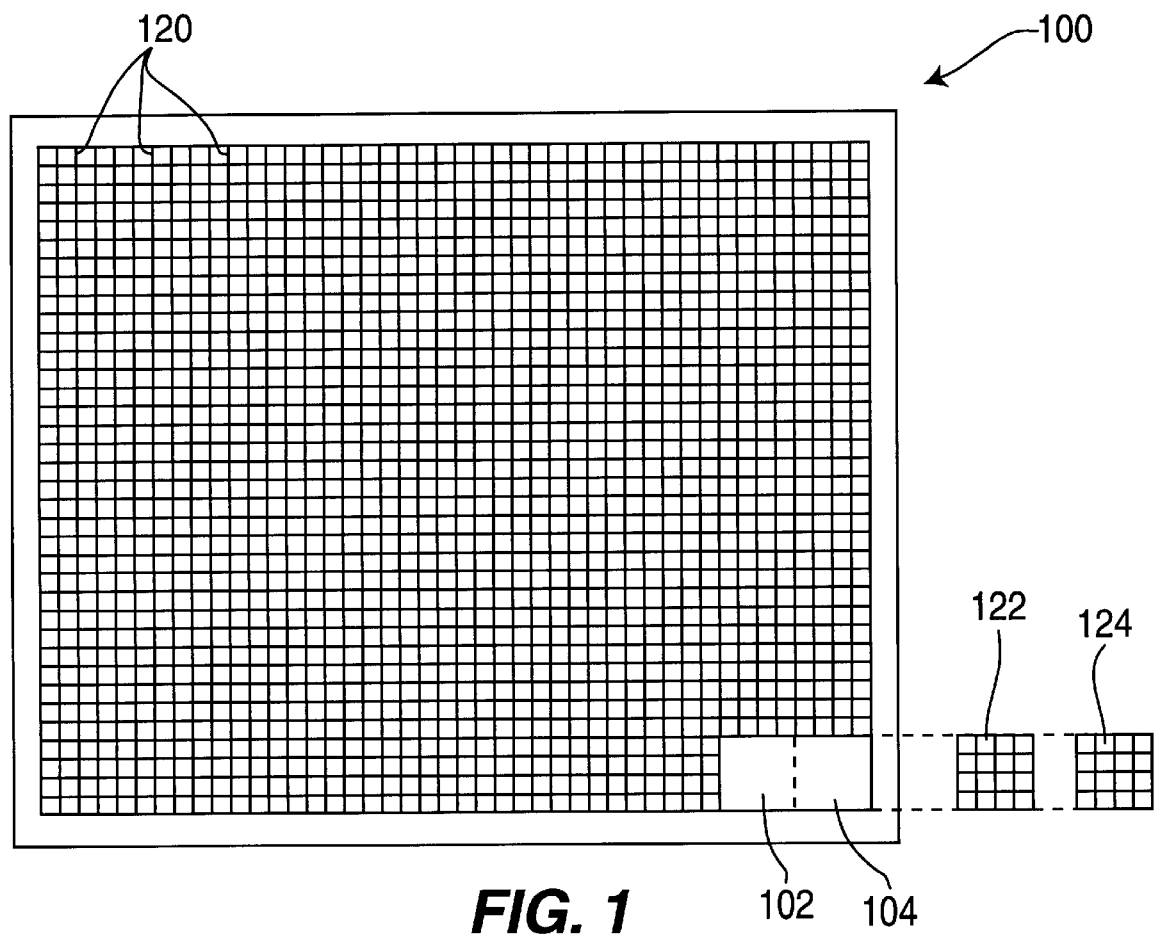
FIG. 1 is a front plan drawing of a large area display device from which two tiles have been removed.

Referring now to the drawing, in which like reference numerals refer to like elements throughout, FIG. 1 is a front plan view of a partially assembled large-area display 100 according to the present invention. The display 100 is a tiled display in which emissive or reflective elements, on which the image pixels are formed, are built as relatively small arrays on tiles 120 and assembled into a frame to produce the large-area display having a large number of pixel forming elements. The display shown in FIG. 1 is missing two tiles 122 and 124. These tiles are inserted into the positions 102 and 104 to complete the display.

Although the display 100 is shown as being formed from tiles having 16 pixel forming elements in a four by four array, it is contemplated that each tile may include many more pixels. In one exemplary embodiment of the invention, described below, each tile includes 896 pixel forming elements arranged as a 32 by 28 matrix. In another exemplary embodiment, each tile extends to the full height or full width of a display 100. These tile sizes are only exemplary. It is contemplated that each tile may include more or fewer pixel forming elements. In addition, it is contemplated that a single display may be formed from tiles having differing numbers of pixel forming elements. For example, a display may have tiles with relatively large numbers of pixel forming elements near the center and tiles having relatively small numbers of pixel forming elements near the edges.

Figure 2:
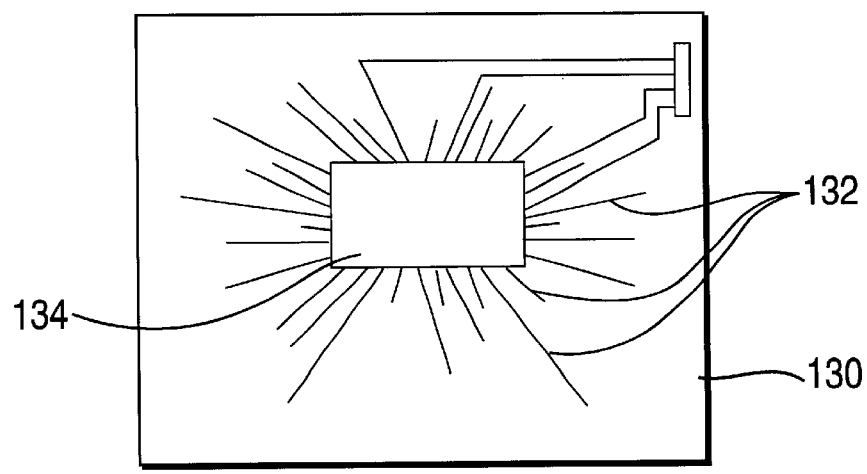
FIG. 2 is a back plan view of a tile suitable for use in the large area display shown in FIG. 1.

FIG. 2 is a back plan view of a tile 120 suitable for use in the large-area display 100 shown in FIG. 1. As shown in FIG. 2, the tile includes a circuit board 130 upon which is mounted at least one integrated circuit 134. The integrated circuit is connected to the pixel forming elements through conductive traces 132 on the circuit board 130 which are coupled to vias (not shown) that extend through the circuit board 130 to make contact with the row or column electrodes of the display device as described below with reference to FIGS. 3–6B. Alternatively, the conductive traces 132 and their corresponding vias may extend along two edges of the display.

In one exemplary embodiment of the invention, the pixel forming elements are made from a light emitting organic material referred to hereafter as, but not limited to, an organic light emitting diode (OLED) material. The basic light emitting structure consists of a thin organic polymer layer sandwiched between a pair of appropriately selected and patterned electrodes. Current flowing from one electrode to the other electrode causes the organic polymer to emit light. At least one of the electrodes is desirably transparent to the emitted light. Indium tin-oxide (ITO) is the usual material used for this purpose. OLED materials provide high brightness and high efficiency, and are relatively low cost materials.

An exemplary display structure according to the present invention is formed in two parts: a display module and an circuit module. These two parts are made separately and then joined to form a complete tile. The display module consists of a transparent glass layer upon which transparent column electrodes are deposited. The OLED material is deposited onto these layers, as the active (i.e., light emitting) medium. Row electrodes are deposited as the final display layer. Additional layers such as blocking or passivation layers may be present to improve the function or life of the display layers. The transparent electrode is preferably the hole injecting electrode and the other electrode is preferably the electron injecting electrode. The OLED materials between the electrodes are preferably conjugated polymer materials that are applied by thick film processes, however, small molecule materials can alternatively be applied by various thin film deposition techniques. The layers are patterned for electrical access to each row and column at one or more points.

As an alternative to the OLED materials, the pixel forming elements of the tiles may be any of a number of emissive devices such as electroluminescent elements, light emitting diodes, field emissive elements, plasma elements or cathodoluminescent elements.

The circuit module is formed by punching or drilling vias through the circuit board and then printing or otherwise depositing the conductive traces on the circuit board. The conductive ink or paste used to form the conductive traces may also fill the vias. The vias make contact with the row and column electrodes of the display module when the circuit module and the display module are joined to form a tile.

One exemplary tile structure consists of a multilayer ceramic circuit board 130 that serves as a substrate upon which: the display material is mounted on the viewer side while the electronics 134 (active and passive) for drive or other functions are mounted mostly on the back side. Conductor elements 132 are printed on the individual layers to provide interconnections between the electronics and the display material, vias interconnect the conductors in different layers; and connectors are provided on the back surface to connect to external power and signal sources. The tile structure may also have a structural layer(s) such as a high softening point metal or insulator to provide freedom from distortion during the processing of the ceramic materials, and/or thermal management during the operation of the display. The tile structure also contains a transparent layer (e.g. float glass) on the viewer surface to protect or contain the display material. A back panel structure may be provided to mount the individual tiles and to provide electrical connection to the power and drive signals needed by each individual tile structure.

The Multilayer ceramic circuit board 130 may be formed of layers of ceramic material. The layers are first formed and processed to form vias, conductors, and other features and then assembled in a stack taking care to carefully align each layer with those layers adjacent to it. Ceramic material here is meant in the broadest sense to include ceramics, glass ceramics, glass, and other high temperature insulating materials. The multiple layers together with the connectors and vias provide the basic function of a circuit board upon which active and passive electrical devices and circuits can be placed.

The conductors 132 may be thin and/or thick film conductors formed by any of the standard processes including, for example plating, evaporation, sputtering, printing and laminating. The materials may be metals or organic conductors. The conductors may be patterned by processes that may include, for example, printing or photolithography. These conductor patterns are formed on the surfaces of the individual layers in the disclosed structure and connect to the vias to provide, according to the design of the device a means of interconnecting the electronics on and external to the disclosed structure to the display material.

Another class of conductors are used to interconnect the layers. These conductors are called vias. Via is used in the broadest sense and includes conductors that go through openings in the layer and those that go around the edge of a layer(s). Vias that go through a layer can be formed, for example, by making a hole in the layer and filling that hole with a conductor. Alternatively, pre-formed physical conductors may be imbedded in the layer. Vias that go over the edge of a layer(s) can be formed by physically placing a wire (round or flat), or array of wires, and wire bonding the ends to the surfaces to be interconnected. Alternatively they can be formed in place by plating or other fabrication process for thick or thin film conductors.

A core layer may also be included in this structure. This layer typically has a higher softening point than the ceramic materials and serves as a substrate for the assembly and processing of the ceramic material. The core layer acts to: eliminate horizontal shrinkage; establish a single coefficient of expansion for the multilayer system, and provide mechanical ruggedness to the multilayer assembly. If the layer is a good electrical conductor it may also provide RF shielding. If the layer is also a good thermal conductor, it contributes to the thermal management of the display. Conductive layers, however, present a special problem for via connections. Via connections through metal layers can be fabricated in several ways: filling the periphery of the hole with an insulating material before putting a metal conductor through the middle, or by putting the conductor only through the middle leaving space separating the conductor from the conductive metal core.

The electronics which form the image processing and pixel driving circuitry are mounted on the layers. Electronics are used in the broadest sense to include both active and passive, and both discrete devices mounted on the layers and devices formed in place by processes such as those now used to make active matrix circuits for displays on various high temperature substrates. While these electronics can be placed anywhere, the most convenient location is the back surface. This permits standard assembly and attachment equipment and processes to be used. In addition, the placing of active or passive devices on the interviewing layers or viewer surface permits greater flexibility in the system design.

The display material is applied to the surface visible to the viewer. Because of the flexibility of the construction of the disclosed structure, different display materials can be used.

The edges of the tiles are desirably carefully formed to ensure that the tiled display has no visible seams between the tiles. One criterion for the tiles is that the spacing between the pixels separated by the tile seam is the same as the spacing of pixels on the tile. To satisfy this criterion, the tile edges are desirably dimensionally precise. Furthermore, if the edges are also used for conductors or if mullions are used to join adjacent tiles, it is desirable to account for the thickness of these conductors or mullions in the design and placement of the tiles.

A backpanel may be provided for the physical mounting and interconnection of the tiles to form a display. The mounting of the tiles is done such that there is a continuity in the pixel spacing over the display. The shape of the tiles is most typically square or rectangular, however the shape can be any shape that can be tiled to form a larger display. Also, the tile is typically flat, but may be curved along one or both dimensions to form curved or domed displays. Curved or domed displays can also be made using flat tiles mounted on a curved or domed backpanel. Tiles may be attached to the backpanel either by permanent connection such as soldering or using connectors which allow the tiles to be plugged into the backpanel. This latter method permits the repair and replacement of individual tiles. Different types of tiles may be attached to different areas of the backpanel- for example, higher resolution areas may be placed in the center or other areas of the large display. In addition, different sized or different shaped tiles may be combined in a single display. For example, tiles near the edges of a large panel may be larger and have a lesser pixel density than tiles near the center of the panel.

The back panel may also provide the means for connecting the tiles to the operational power and data signals needed to operate the tile. Matching connectors may be provided on both the backside of the tile and the backpanel to provide this connection. In the case of the data signal connections, optical connection may be used as an alternative to physical connection.

The electrical structure of the backpanel provides for the distribution of power and signals to the tiles, and the electrical structure of the tiles provide for the addressing of the display pixels. Both levels of structure are described. The information needs of a tiled display increase with the size of the display as measured in total number of pixels. A greater number of pixels on a tile translates to greater amounts of data stored on the tile and greater rates of information transfer.

If the backpanel is formed of float glass, it may be susceptible to breaking easily and at high temperatures may undergo compaction and may undergo dimensional changes. For mechanical strength, a float glass back panel is often made thick which results in a heavy back panel. In an exemplary embodiment, the backpanel is comprised of a metal having a coefficient of expansion substantially similar to that of the front panel. A metal back panel provides improved mechanical strength, stability during high temperature processing, and light weight if use thin layers.

In an exemplary embodiment having a front panel comprised of float glass, the back panel may be comprised of titanium or a titanium alloy. Physical and electrical structures may be formed on a metal back panel using LTCC-M technology, for example. Structures including dielectrics, conductors, ribs, and spacers may be formed on the back panel using thin film (evaporation/sputtering through physical masks or photolithographic masks), thick film (silk-screen printing, ink-jet printing), and laminating.

One advantage of the tiled display is that the scan electronics can be internal to the tile and the scan rate of any one tile is the same for a small display or for a large display. This ensures that the brightness and gray scale of the display do not degrade with increasing size. The tiled displays described in detail below have an architecture which connects the signals to the pixels without interrupting the continuity of the pixel spacing, even at the edges of the tiles. The disclosed tiled displays may also have signal processing circuitry which extracts the signal information for that tile from a broadcast information signal and transforms the extracted information into the signals needed to address that tile.

In general, the front-to-back connections include one for each row of pixels and one for each column of pixels on the tile. Tiled displays have relatively few pixels so the number of interconnects per tile is relatively small and the yield on individual tiles can be high. This is a significant advantage of tiled displays when compared to fabrication of large displays from single substrates. In general, the yield is a function of the number of pixels in the display device.

The final connection to the row or column is made with a via that extends from the back surface of the tile. This via has a diameter less than the spacing of a pixel. To accomplish this, the portions of the vias in the display layer(s) may be made smaller than the vias through the other intervening layers, and, as described below, the connections may be staggered over the area of the tile to provide maximum spacing between the wider interconnects. These connections are the final link in the distribution of the display signals to the pixels.

Figure 3:
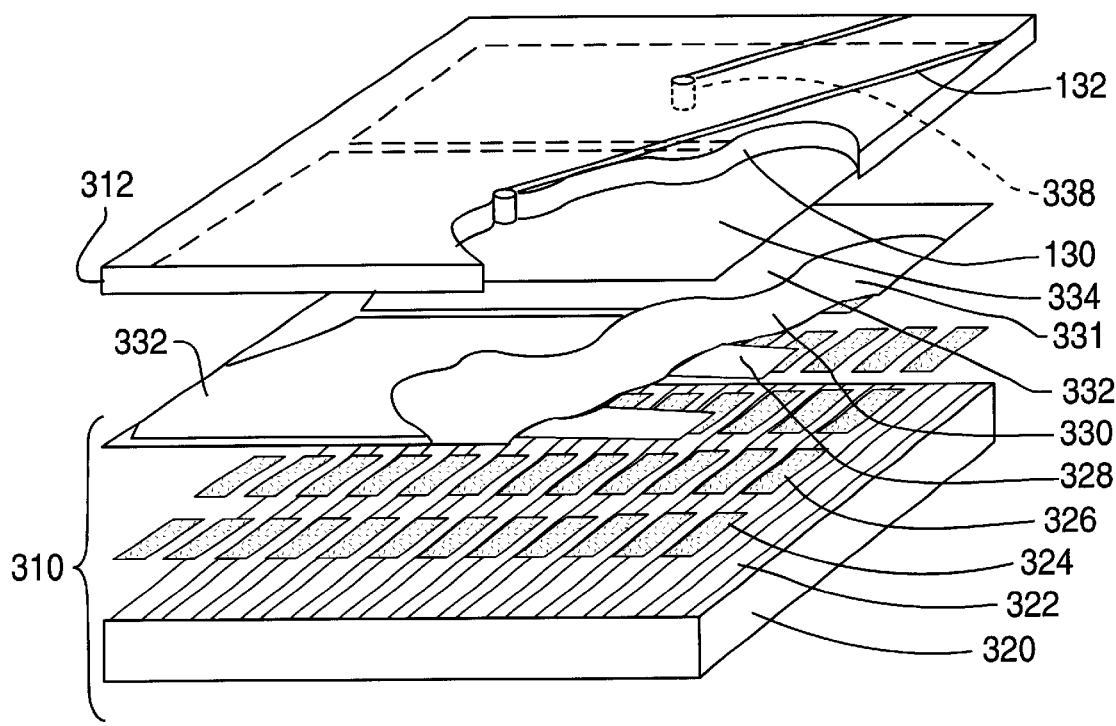
FIG. 3 is an exploded perspective drawing which illustrates a structure that may be used to implement the tile shown in FIGS. 1 and 2.

FIG. 3 is an exploded perspective diagram which shows an exemplary display structure. The tile structure is formed in two parts: the display module and the circuit module.

The display module includes a transparent front plate 320 which may be, for example, a float glass plate. Transparent column electrodes 322 are formed on the front plate 320 by depositing thin bands of a transparent conductor, such as indium-tin oxide (ITO), using well known processes. The red, green and blue OLED materials or other display materials 324 and 326 are deposited on top of the column electrodes to define the active area of the pixel. As described below with reference to FIG. 5, it is desirable for the display materials 324 and 326 (shown in FIG. 3) to occupy only a portion (e.g. about 25 percent) of the pixel area. An electron injecting electrode (e.g. calcium) may then be formed upon the OLED material. The row electrodes 328 are formed on top of the display materials 324 and 326. The row electrodes 328 may be formed, for example, from polysilicon or from a metal such as aluminum using standard deposition techniques. An insulating layer 330 is formed on top of the row electrodes 328. The exemplary insulating layer 330 may be formed from any of a number of insulating materials. To protect the display materials, the insulating layer 330 is desirably formed using low-temperature processes. Exemplary materials include Polyimide or other low-temperature inorganic materials. The insulating layer 330 may be applied using thick film or thin film deposition techniques. The insulating layer 330 includes a plurality of openings 331 aligned with the row electrodes 328 or column electrodes 322.

On top of the insulating layer 330 are deposited a plurality of connecting plates 332. The plates 332 may be formed using, for example, vapor deposited aluminum or a metallic ink or paste, such as silver combined with a solvent, which is deposited using thick film processes. As described below with reference to FIGS. 5 and 6, the connecting plates are coupled to the column electrodes 322 and row electrodes 328 (shown in FIG. 3) by vias which extend through the openings in the insulating materials. Each of the exemplary connecting plates makes electrical contact with only one row electrode 328 or one column electrode 322. To ensure that a good connection is made, however, each connecting plate 332 may connect to its corresponding row or column electrode 328, 322 at several locations.

The circuit module 312 includes image processing and display driving circuitry 134 (see FIG. 2); a circuit board 130, which may be, for example, a thin sheet of alumina ($Al_2O_3$); deposited electrical conductors 132; and connecting pads 334 vias 338 which electrically connect the conductors 132 to the connecting pads 334 through the circuit board 130. The conductors 132, vias 338 and connecting pads 334 may all be formed using thick film deposition processes to apply a metallic ink or paste. The connecting pads 334 may also be formed from vapor-deposited aluminum. There is a one-to-one relationship between the connecting pads 334 of the circuit module and the connecting plates 322 of the display module. In an exemplary embodiment of the invention, described below with regard to FIG. 7, the connecting pads 334 and the connecting plates 332 (shown in FIG. 3) are electrically connected by applying an anisotropically conductive adhesive between the display module and the circuit module. The combined display module and circuit module forms a tile 120.

It is contemplated, however, that other methods may be used to electrically connect the connecting pads to their respective connecting plates. For example, the connecting plates 332 and connecting pads 334 may be made from a deformable material and patterned to include a portion which extends above the plane of the pad or plate. When the circuit module is mated to the display module, the patterned material on the connecting plates 322 and connecting pads 334 comes into contact and deforms, forming an electrical connection between the corresponding connecting pads and plates. This deformation also accommodates defects, such as hard particles, which might otherwise make the spacing non-uniform and display unusable. The pads 334 and plates 332 may also be connected by bump-bonding techniques or using wires that are implanted in one of the pads 334 or plates 332 and engage the plate 332 or pad 334 when the circuit module 312 is mated to its corresponding display module 310.

Figure 4:
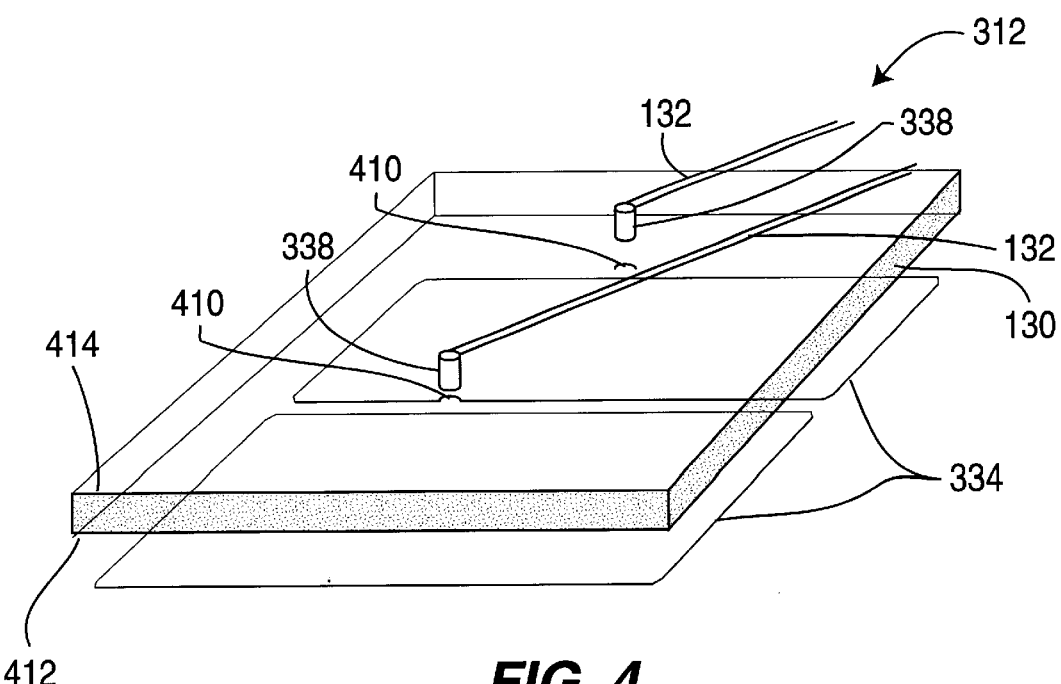
FIG. 4 is an exploded perspective drawing which illustrates the electrical connecting structure of the tile structure shown in FIG. 3.

FIG. 4 is an exploded perspective drawing of a portion of the circuit module 312. This drawing more clearly shows the electrical connecting structures of the circuit module. The circuit board 130 includes a plurality of openings 410 each of which corresponds to a respective connecting pad 334. The vias 338 are formed in the openings 410 at the same time that the connecting pads 334 are formed on the front surface 412 of the circuit board 130. The electrical conductors 132 are formed on the back surface 414 of the circuit board 130 to connect the image processing and display driving circuitry 134 (see FIG. 2) to the various connecting pads 334.

Figure 5:
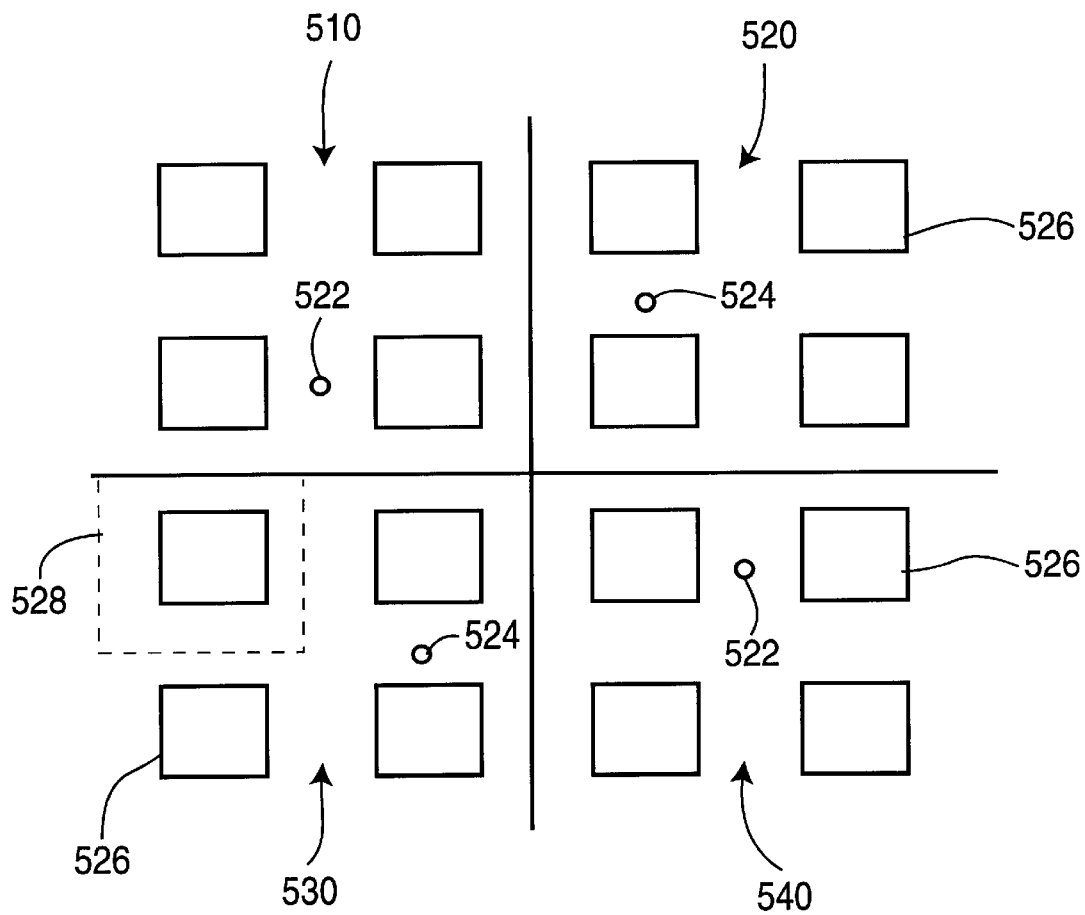
FIG. 5 is a pixel diagram which shows an exemplary pixel layout for portions of four tiles having the structure shown in FIG. 3.

FIG. 5 shows a pixel layout suitable for use for a tile such as that shown in FIG. 3. FIG. 5 illustrates portions of 4 tiles 510, 520, 530, 540. In the layout shown in FIG. 5, the active portions 526 of the pixels are centered in their respective pixel regions 528. Row electrodes (see FIG. 3) and column electrodes (see FIG. 3) may be coupled by conductors 522 and 524, respectively, to corresponding vias on the circuit module.

Figure 6:
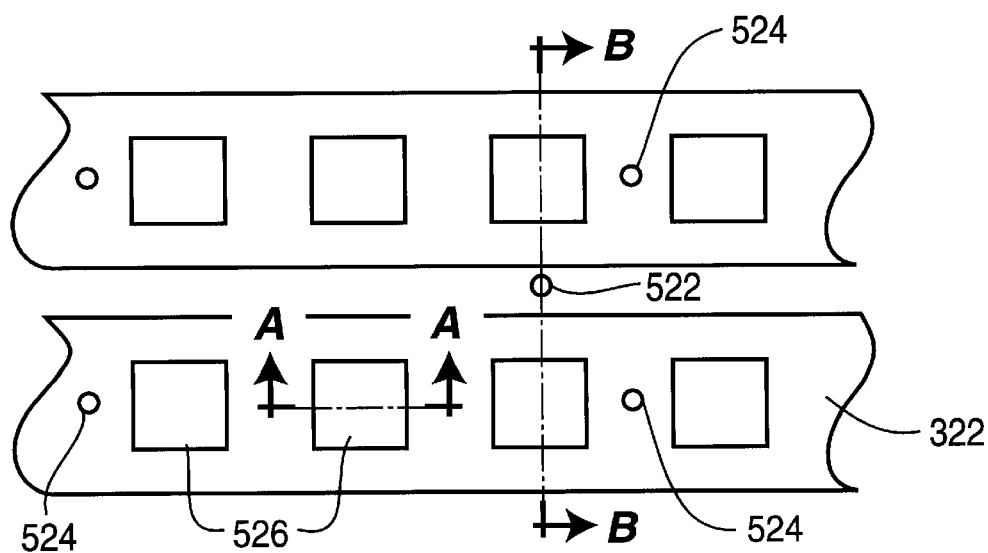
FIG. 6 is a top view of a display material formed upon a column electrode.
Figure 6A:
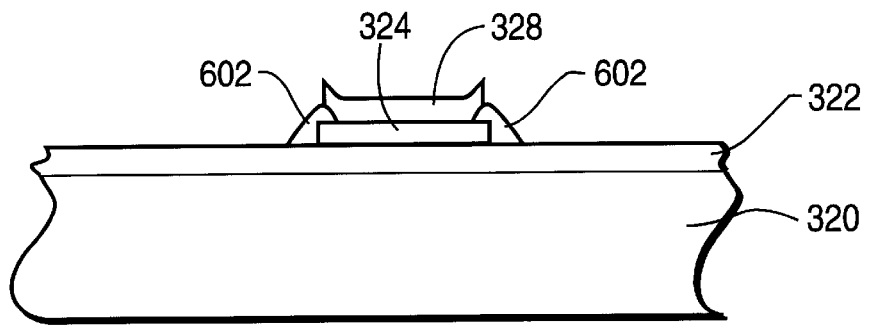
FIG. 6A is a cross-sectional view taken along line A—A of FIG. 6 illustrating an exemplary embodiment of pixel sealing according to the present invention.
Figure 6B:
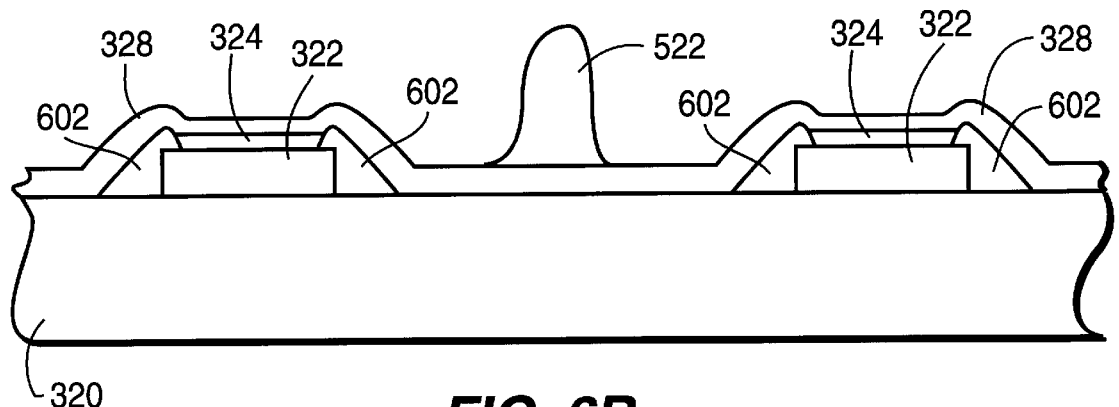
FIG. 6B is a cross-sectional view taken along line B—B of FIG. 6 illustrating pixel sealing according to an exemplary embodiment of pixel sealing according to the present invention.

FIG. 6 shows a top view of a portion of a display module of an electronic display structure according to the present invention. FIGS. 6A and 6B illustrate are cross-sectional views taken along lines A—A and B—B, respectively, of FIG. 6 to illustrate an exemplary pixel sealing mechanism according to the present invention.

A transparent column electrode 322 such as ITO is formed on the front plate 320. A display material 324 formed upon the column electrode 322 defines the active portion 526 of the pixel. As shown in FIGS. 6A and 6B, an insulator 602 such as SiO2 is then deposited on the ends of the display material 324. A row electrode 328 is then formed upon the display material 324 and the insulator 602. The insulator 602 allows the row electrode 328 to be formed wide enough to completely encapsulate the display material without shorting the row electrode 328 to the column electrode 322. Thus, the display material is encapsulated by the row electrode 328, the insulator 602, the column electrode 322, and possibly the front plate 320. This encapsulation seals the display materials 324 to help prevent exposure of the display materials to conditions including oxygen and water vapor to provide more predictable performance over a longer lifetime. In another exemplary embodiment of the present invention, the insulator 602 covers the display material 324 and the row electrode 328 contacts the display material 324 through a via (not shown) formed in the insulator 602.

FIG. 6 illustrates exemplary positions of conductors 522 and 524 for coupling row electrodes and column electrodes, respectively, to the circuit module. In FIG. 6B, a conductor 522 is shown as formed upon the row conductor 328 between adjacent pixels. The conductor 522 shown in FIG. 6B is illustrated as a conductive bump.

Figure 6C:
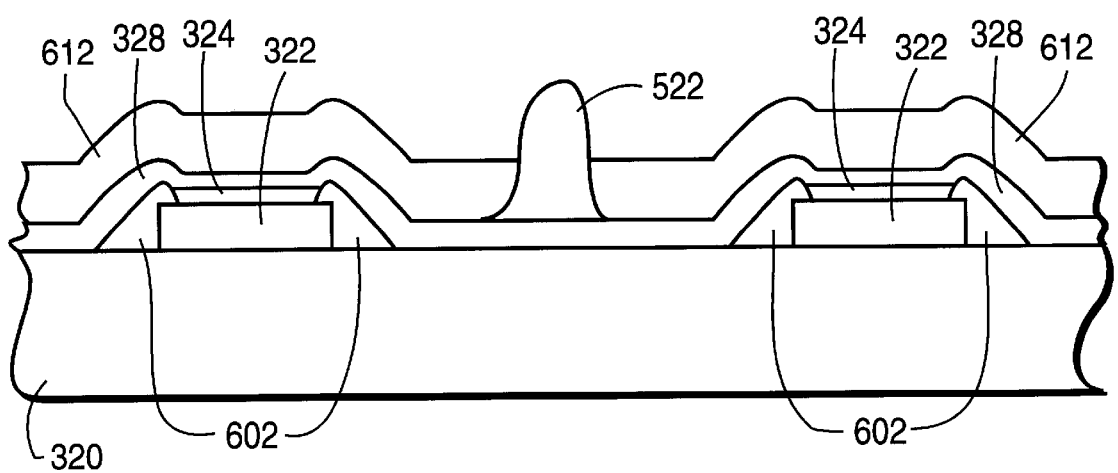
FIG. 6C is a cross-sectional view taken along line B—B of FIG. 6 illustrating an insulating pad according to an exemplary embodiment of the present invention.

FIG. 6C is a cross-sectional view taken along line B—B of FIG. 6 illustrating an insulating pad 612 formed upon the row electrodes 328, column electrodes 322 and the display materials 324. Conductors 522 may be formed in apertures in the insulating pad 612.

Figure 7:
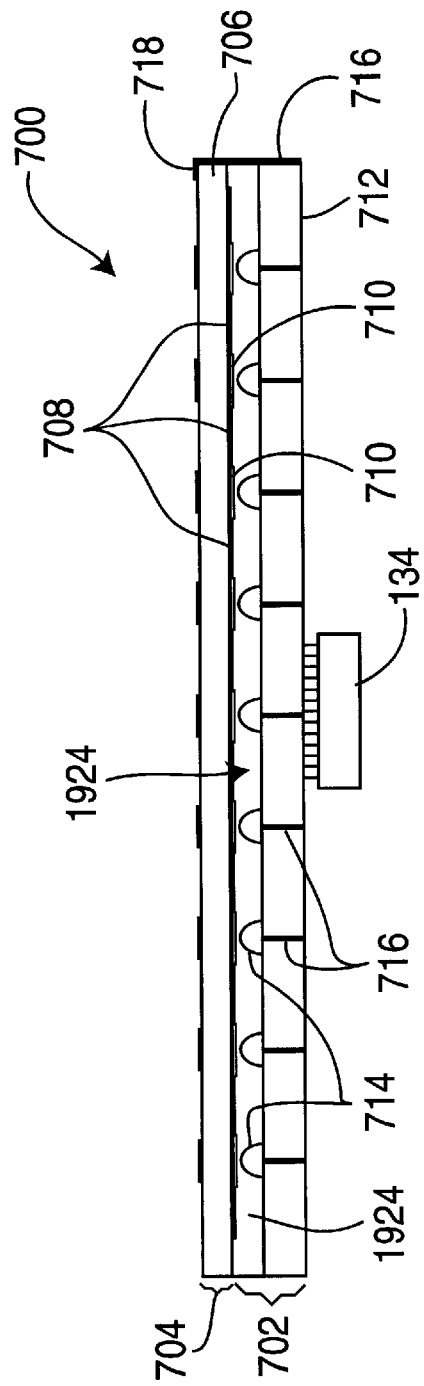
FIG. 7 is a cross-sectional view of a tile illustrating an exemplary embodiment of area sealing and an exemplary embodiment of edge sealing according to the present invention.

FIG. 7 is a cross-sectional view of an electronic display structure (tile) 700 illustrating an exemplary embodiment of area sealing and an exemplary embodiment of edge sealing according to the present invention. Although the exemplary sealing mechanisms are described in FIG. 7 shown with regard to a bottom emitting OLED display, as known to those skilled in the art, the teachings of the present invention are generally applicable to other display technologies.

The tile 700 includes a display module 704 and a circuit module 702, each composed of multiple layers. The display module 704 consists of a glass substrate 706 on which are deposited active display materials 708 including transparent hole injecting electrodes (e.g. ITO), OLED material(s), electron injecting electrodes (e.g. calcium), and contact layer(s) 710. Light is emitted by the OLED material(s) and exits the display structure 700 through the transparent electrode and glass substrate 706 (this is termed a bottom emitter structure because the light exits through the substrate for the OLED material). The circuit module 702 consists of an insulating substrate 712 with contact layer(s) 714 that match the contact layers 710 of the display module 704, electrical vias 716 that connect these contacts 714 to conductors on the opposite surface of the insulating substrate 712 and to an integrated circuit(s) 134.

The circuit module 702 simultaneously functions as a barrier layer for sealing the display structure 700, a back substrate for the display structure 700, and as an electrical circuit board. The circuit module 702 and the display module 704 form a display structure 700 by being joined together.

In this exemplary embodiment, the circuit module 702 and the display module 704 are coupled together by an area seal which encapsulates the row electrodes, the column electrodes, and the portions of display material of the display module 704. The area seal may be formed by applying an adhesive such as an epoxy. The adhesive may be applied as a fluid or paste, but may also be supplied as a preformed sheet or as a powder. Examples of processes for applying the seal/contact materials include printing (silk screen, inkjet, contact, roller, and others); dispensing from a syringe or similar dispenser; doctor blade coating, or introduction by capillary action. Actual mechanical bonding results from the adhesive nature of the seal materials. Examples of processes for activating adhesion include catalysts, heat, or electromagnetic energy, or alternatively, physical processes such as ultrasonic welding and pressure may be used.

In another exemplary embodiment, the area seal comprises an anisotropically conductive structure for encapsulating the plurality of row electrodes, the plurality of column electrodes, and the plurality of portions of the display material, while coupling each of the plurality of row and column electrodes to a respective electrical via 716.

In an exemplary embodiment, the area seal and/or the anisotropically conductive structure is substantially black. The adhesive used to form the area seal or the anisotropically conductive structure may not normally be black. These materials may be made black by adding a black pigment or dye. Carbon black is an example of a suitable black pigment. If carbon black is added at too high a concentration it will make the sealing material too conductive and interfere with making contacts. Concentrations from 0.1% to 10% (based on weight) effectively absorb light but do not make the sealing material too conductive. Black organic dyes do not add conductivity. These may be added in concentrations that make the sealing material a good light absorber.

Because the electron injecting electrodes are located between the viewer and the black sealing material, the black sealing material can not absorb light reflected by the electrodes. Therefore it is desirable to minimize the light reflection by these electrodes. The transparent hole injecting electrodes are not an issue as they do not reflect light strongly. The electron injecting electrodes, however, are typically made of reflective metals such as Ca, Mg, and or Al. Reflections from these electrodes can be minimized by minimizing their area or by coating the viewer side of these electrodes black. Minimizing their area simultaneously maximizes the area of the black material available to absorb ambient light. Coating the viewer side of the electron injecting electrode black can be accomplished by first depositing a black coating in all areas where metal electrodes will be later deposited.

The anisotropically conductive structure seals and simultaneously seals while electrically conducting in one direction and is a relative insulator in other directions. The anisotropically conductive structure conducts in a direction from a contact layer(s) 714 of the circuit module 702 to a corresponding contact layers 710 of the display module 704.

The contact layer(s) 714 shown in FIG. 7 are formed as bumps and the contact layers 710 are shown as contact pads. The anisotropically conductive structure may be formed using a combination of a variety of conductive and sealing mechanisms including those described below.

For a display structure as shown in FIG. 3, the row and column electrodes are coupled through an insulating layer 330 to connecting plates 332. The signal lines provided by the integrated circuit 134 are coupled through vias to connecting pads 334. The display module 310 and circuit module 312 of FIG. 3 may be coupled using an anisotropically conductive structure (ACS) according to the present invention.

In an exemplary embodiment, the ACS comprises an anisotropically conductive adhesive which seals while conducting in a direction from each connecting plate 332 to its corresponding connecting pad 334. The use and composition of anisotropically conductive adhesives is taught by Yamada et al. in "Components and Materials for Liquid Crystal Display(LCD)" published as a marketing technical publication by the Sony Chemical Corporation which is hereby incorporated by reference for its teachings on anistropically conductive adhesives. The material used to join the display and circuit board layers may be made with epoxy resins, other two part heat or photo curable adhesives, moisture catalyzed adhesives, and thermoset or thromoplastic polymers. The material is loaded with conductive additives such as conducting particles, particles with a conducting coating, conducting filaments, conducting flakes, and conducting filaments and flakes that are magnetic. The asymmetric electrical properties are imparted to these seal/conductor materials by performing an asymmetric unit process. Examples of asymmetric processes for achieving asymmetrical conductivity include applying pressure, material flow, electric field or magnetic field alignment, and electromigration.

In an exemplary embodiment, the ACS includes bumps formed on one or both of the connecting plates 332 and their corresponding connecting pad 334 to improve electrical conductivity between the plates 332 and pads 334. Multiple bumps may be used for redundancy and to further improve electrical conductivity. The bumps may be formed so when the display module 310 and the circuit module 312 are sealed, corresponding bumps are in contact. Alternatively, the bumps may be malleable so then compress when contacted to further improve the electrical conductivity between them and to allow for misalignment. Alternatively, adhesive is not conductive and electrical connection is made through the bumps.

As known to those skilled in the art, the teachings of the present invention may be applied without using the insulting layer 330 and contact pads and plates 332, 334 of FIG. 3. The ACS does may directly couple each of the row and column electrodes to a corresponding contact on the circuit module. For example, the anisotropically conductive adhesive may be applied to make a contact between a via on the circuit module and an inter pixel position on a row or column electrode. In an exemplary embodiment, this contact is made using a bump contact 522 shown in FIG. 5. In another exemplary embodiment, the ACS includes dabs of a conductive adhesive formed at contact points and the surrounding area is filled with a non-conducting or anisotropically conducting adhesive.

The present invention provides an improved electronic display structure. Rather than have separate steps of making electrical contacts and then independently sealing a structure, the ACS as described above allows for simultaneous sealing and electrical conduction. This improves both the manufacturing process and the manufactured display structure. The display structure is improved by having an area seal which may serve to encapsulate the display materials. In addition, the adhesives included in the ACS may be chosen to be resilient to compensate for differences in thermal expansion between the circuit module and the display module.

Figure 7A:
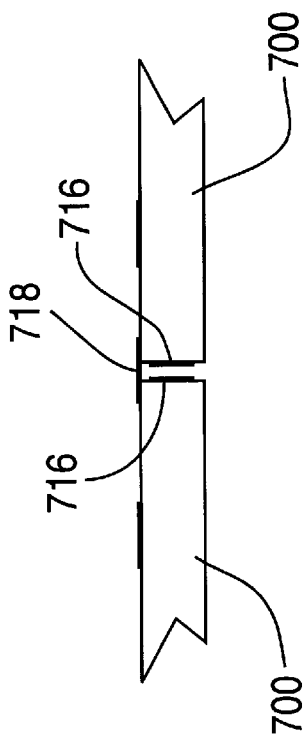
FIG. 7A is a cross-sectional view of adjacent tiles illustrating a masking layer in combination with edge sealing according to the present invention.

The display structure 700 in FIG. 7 also includes an edge seal or band seal 716. The band seal 716 spans from the display module to the circuit module and extends around the outer perimeter of the circuit and display modules. The display structure 700 also includes a masking layer formed on an end of the band seal wherein the masking layer acts to hide the band seal when the display structure is viewed through the glass substrate 706. FIG. 7A illustrates adjacent electronic display structures 700 each having a band seal 716 and a masking layer 718 formed upon their glass substrates 706 to hide the band seals 716. In an exemplary embodiment, the band seal 716 is comprised of one of metal, glass, and polymer (e.g. Kapton).

Figure 8:
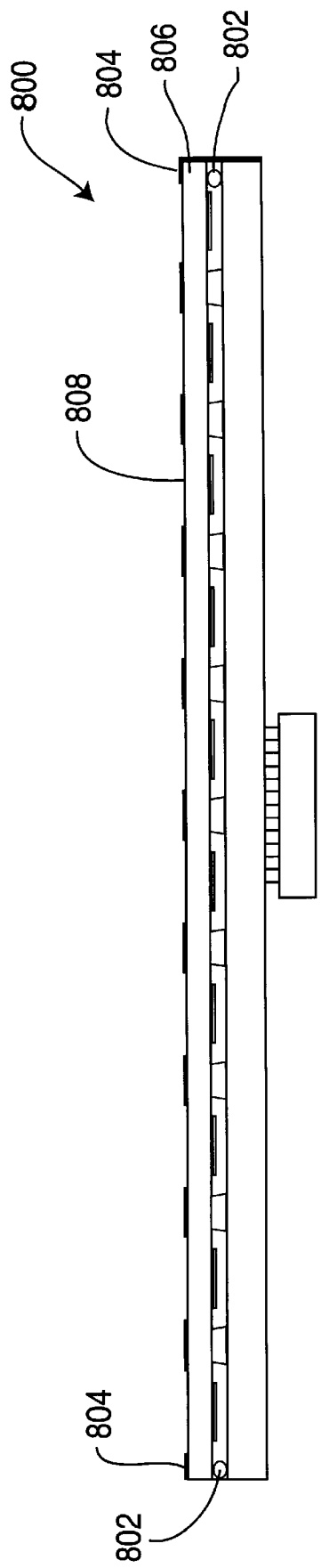
FIG. 8 is a cross-sectional view of a tile illustrating a bead seal according to the present invention.

FIG. 8 is a cross sectional view of an electronic display structure 800 having a bead seal 802 according to the present invention. The bead seal 802 is formed around the perimeter of the display structure 800 between the circuit module and the display module. In an exemplary embodiment, a masking layer 804 is formed opposite the circuit module at least on the bead seal or on the front or back surfaces of the glass substrate 806 of the display module.

The masking layer 804 acts to hide the bead seal when the display structure is viewed from the front surface 808 of the substrate. The masking layer 804 shown in FIG. 8 is formed upon the front surface 808 of the glass substrate 806. In an exemplary embodiment, the thickness of the glass substrate 806 is less than the gap between adjacent pixels. In an exemplary embodiment, the bead seal 802 has a width less than one-half of the gap between adjacent pixels of the display structure 800 so the visibility of the seam between adjacent display structures 800 will be minimized. In an exemplary embodiment, the bead seal is black.

In an exemplary embodiment, the bead seal 802 is substantially uniform throughout the perimeter of the display module 800. This is possible according to the present invention because it is not necessary for electrical connections to be conducted through the bead seal and because they may be conducted through the tile itself to the driving circuitry on the back side of the circuit module.

Figure 9:
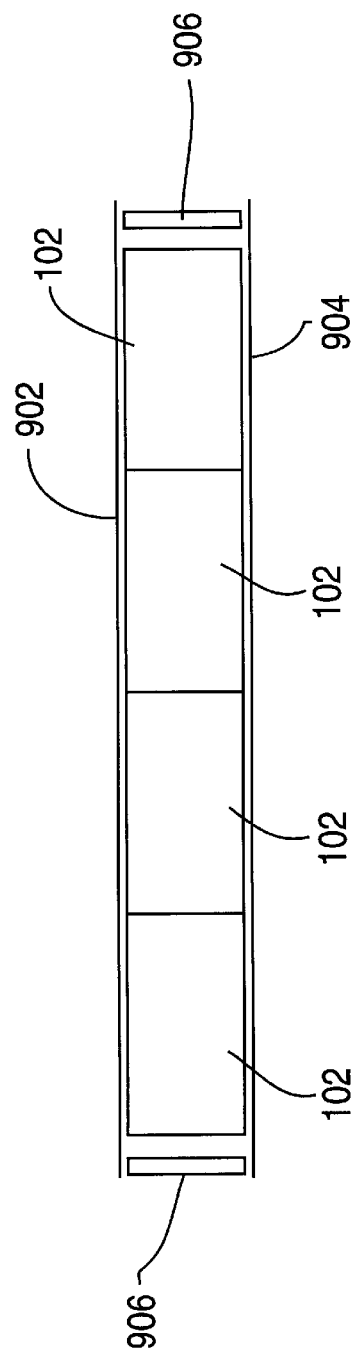
FIG. 9 is a cross-sectional view of a display seal according to the present invention.

As shown in FIG. 9, in combination with the sealing methods described above, an entire display including tiles 102 may be sealed using a display seal. The display seal includes a front plate 902, a back plate 904 and a seal 906 therebetween. The tiles 102 are oriented so the front glass of the tiles 902 are adjacent the front plate 902 of the display seal. According to the present invention, each tile may include circuitry to provide signals to drive its respective pixels. Thus, the display seal need not accommodate any circuitry aside from providing a signal path from tiles within the display seal to a signal source outside the display seal.

The different sealing mechanisms according to the present invention may be applied independently or in combination. For example, the pixel sealing mechanism, the area sealing mechanism, and the edge sealing mechanism may be combined in a single electronic display structure. This provides a further advantage of reducing the need for a robust bead seal which allows the edge of a tile to be made smaller so tiles may be joined with visually imperceptible seams.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. An electronic display structure comprising:
    a display module including:
        a first substrate having a plurality of column electrodes;
        a plurality of row electrodes;
        a plurality of portions of a display material, each coupled to one of the plurality of row electrodes and to one of the plurality of column electrodes; and
    an area seal formed upon the first substrate and encapsulating the row electrodes, the column electrodes, and the portions of display material.

2. An electronic display structure according to claim 1 wherein the area seal comprises an anisotropically conductive structure for encapsulating the plurality of row electrodes, the plurality of column electrodes, and the plurality of portions of the display material, and for coupling each of the plurality of row and column electrodes to a respective signal line.

3. An electronic display structure according to claim 2 further comprising a circuit module including a plurality of signal lines each corresponding to one of the plurality of row and column electrodes wherein the anisotropically conductive structure seals the circuit module and the display module, adheres the circuit module to the display module, and couples each of the plurality of row and column electrodes to its respective signal line.

4. An electronic display structure according to claim 3 wherein the anisotropically conductive structure is substantially black.

5. An electronic display structure according to claim 3 wherein the anisotropically conductive structure includes:
    a plurality of conductive bumps formed on at least one of a row or column electrode and its corresponding signal line to couple one of the plurality of row and column electrodes to its corresponding signal line; and
    an adhesive for sealing the circuit module and the display module and adhering the circuit module to the display module.

6. An electronic display structure according to claim 3 wherein the anisotropically conductive structure includes:
    an anisotropically conductive sealant including a mixture of an adhesive and conductive particles wherein causing one of localized pressure, localized magnetic field, and localized electromigration causes the conductive particles to couple each of the plurality of row and column electrodes to its corresponding signal line.

7. An electronic display structure according to claim 6 wherein the anisotropically conductive structure further includes a plurality of conductive bumps extending at least partially between the plurality of signal lines and their corresponding row or column electrodes.

8. An electronic display structure according to claim 3 wherein each of the plurality of portions of the display material is formed upon one of the plurality of column electrodes is encapsulated by one of the plurality of row electrodes formed thereupon.

9. An electronic display structure according to claim 3 further comprising a band seal spanning from the display module to the circuit module and extending around the perimeter of the circuit and display modules.

10. An electronic display structure according to claim 1 further comprising a display seal to encapsulate the display structure.

11. An electronic display structure according to claim 8 further comprising an insulating pad formed upon the first substrate, the plurality of column electrodes, the plurality of row electrodes, and the plurality of portions of the display material, and including apertures for coupling each of the plurality of row and column electrodes to its respective signal line.

12. An electronic display structure comprising:
    a display module;
    a circuit module including a plurality of signal lines; and
    an anisotropically conductive structure for adhering the circuit module to the display module, and for electrically coupling signals between the circuit module and the display module.

13. An electronic display structure comprising:
    a display module including:
        a plurality of column electrodes, and
        a plurality of portions of a display material, each having a first side coupled to one of the plurality of column electrodes and a second side,
        a plurality of row electrodes coupled to each of the plurality of portions of the display material, and
        sealing means for sealing each of the plurality of portions of the display material.

14. An electronic display structure according to claim 13 wherein the sealing means comprises
    a plurality of row electrodes coupled to and encapsulating each of the plurality of portions of the display material.

15. An electronic display structure according to claim 14 further comprising a band seal spanning from the display module to the circuit module and extending around the perimeter of the circuit and display modules.

16. An electronic display structure according to claim 13 wherein the sealing means comprises an insulating layer formed upon each of the plurality of portions of the display material wherein the insulating material has a via formed therein to the display material and the row electrode contacts the display material through the via.

17. An electronic display structure according to claim 14 wherein the display material includes an organic electroluminescent material.

18. An electronic display structure comprising:
    a display module including a substrate with a first surface and a second surface, the display module having an outer portion, and an inner portion, the inner portion including:
        a plurality of column electrodes formed on the first surface of the substrate,
        a plurality of row electrodes, and
        a plurality of portions of a display material, each controlled by one of the plurality of row electrodes and by one of the plurality of column electrodes;
    a circuit module having an outer area and an inner area, the inner area including a plurality of signal lines each corresponding to one of the plurality of row and column electrodes;
    a bead seal having a first side coupled to the outer area of the circuit module and a second side coupled to the outer area of the display module; and a masking layer formed opposite the circuit module on one of the bead seal, the first surface of the substrate, and the second surface of the substrate, wherein the masking layer acts to hide the bead seal when the display structure is viewed from the first surface of the substrate.

19. An electronic display structure according to claim 18 wherein the circuit module has a back side including an integrated circuit and the row electrodes and column electrodes are coupled to the integrated circuit through electronic display structure.

20. An electronic display structure according to claim 18 wherein each of the plurality of portions of the display material corresponds to a pixel and a gap is formed between adjacent pixels on the substrate and the bead seal has a width less than one-half of the gap between adjacent pixels.

21. An electronic display structure according to claim 18 wherein each of the plurality of portions of the display material is encapsulated by one of the plurality of row electrodes.

22. An electronic display structure according to claim 18 wherein the bead seal is substantially uniform throughout the outer area of the display module.

23. An electronic display structure comprising:
a display module including a substrate with a first surface and a second surface, the display module having an outer portion, and an inner portion, the inner portion including:
a plurality of column electrodes formed on the first surface of the substrate,
a plurality of row electrodes, and
a plurality of portions of a display material, each controlled by one of the plurality of row electrodes and by one of the plurality of column electrodes;
a circuit module having an outer area and an inner area, the inner area including a plurality of signal lines each corresponding to one of the plurality of row and column electrodes;
a substantially uniform bead seal having a first side coupled to the outer area of the circuit module and a second side coupled to the outer area of the display module.

24. An electronic display structure comprising:
a display module having an outer perimeter;
a circuit module having an outer perimeter and coupled to the display module;
a band seal spanning from the display module to the circuit module and extending around the outer perimeter of the circuit and display modules; and
a masking layer formed on an end of the band seal wherein the masking layer acts to hide the band seal when the band seal is viewed through the display module.

25. An electronic display structure according to claim 24 wherein the band seal is comprised of one of metal, glass, and polymer.

26. An electronic display structure according to claim 24 wherein the circuit module has a back side including an integrated circuit and the row electrodes and column electrodes are coupled to the integrated circuit through electronic display structure.

27. An electronic display structure according to claim 24 wherein the display module includes a plurality of portions of a display material each formed upon one of a plurality of column electrodes and each encapsulated by one of a plurality of row electrodes for sealing each of the plurality of portions of the display material.

28. An electronic display structure comprising:
a display module having an outer perimeter;
a circuit module having an outer perimeter and coupled to the display module;
a substantially uniform band seal spanning from the display module to the circuit module and extending around the outer perimeter of the circuit and display modules.

* * * * *